United States Patent [19]

Bodin

[11] 4,040,122
[45] Aug. 2, 1977

[54] METHOD AND APPARATUS FOR REFRESHING A DYNAMIC MEMORY BY SEQUENTIAL TRANSPARENT READINGS

[75] Inventor: Leslie J. Bodin, Stonybrook, N.Y.

[73] Assignee: Burroughs Corporation, Detroit, Mich.

[21] Appl. No.: 674,391

[22] Filed: Apr. 7, 1976

[51] Int. Cl.² .................... G11C 7/00; G06F 13/00
[52] U.S. Cl. ........................... 364/900; 340/173 DR
[58] Field of Search ............... 340/172.5, 173 DR; 445/1; 364/900

[56] References Cited

U.S. PATENT DOCUMENTS

| | | | |
|---|---|---|---|
| 3,541,530 | 11/1970 | Spampinato et al. | 340/173 DR |
| 3,699,544 | 10/1972 | Joynson et al. | 340/173 DR |
| 3,748,651 | 7/1973 | Mesnik | 340/173 DR |
| 3,760,379 | 9/1973 | Nibby, Jr. et al. | 340/173 DR |
| 3,846,765 | 11/1974 | De Vries | 340/173 DR |
| 3,858,184 | 12/1974 | De Vries | 340/173 DR |
| 3,940,747 | 2/1976 | Kuo et al. | 340/173 DR |

OTHER PUBLICATIONS

Hoff, Jr., "Silicon-Gate Dynamic Mos Crams 1024 Bits on a Chip", in Electronics, Aug. 3, 1970, pp. 68-73.
Terman, "Avoidance of Refresh Times in Dynamic Memories", in IBM Technical Disclosure Bulletin, vol. 15, No. 7, Dec. 1972; pp. 2056-2058.
Gerardin et al., "Transparent Refreshing for Semiconductor Dynamic Random-Access Memory", in IBM Tech. Discl. Bull., vol. 16, No. 3, Aug. 1973, pp. 934-936.

Primary Examiner—Melvin B. Chapnick
Attorney, Agent, or Firm—Hane, Sullivan & Spiecens

[57] ABSTRACT

A data processing system which includes a central processing unit, a refresh control unit, and a dynamic memory unit whose memory cells require periodic refreshing and which are refreshed merely by being read. After the reading of a group of memory cells and the transfer of at least one of the memory cells of the group in response to read and select signals generated by the refresh control unit and address signals generated by the central processing unit, the refresh control unit by generating another read signal and address signals causes another group of memory cells to be read and thus refreshed. However, this other group of memory cells is not transferred from the dynamic memory unit because the refresh control unit does not generate the select signals required to effect a transfer.

6 Claims, 5 Drawing Figures

METHOD AND APPARATUS FOR REFRESHING A DYNAMIC MEMORY BY SEQUENTIAL TRANSPARENT READINGS

BACKGROUND OF THE INVENTION

This invention pertains to data processing memories and more particularly to dynamic memories requiring periodic refreshing.

Dynamic memories use stored charge in capacitors or equivalent charge storing elements to remember the data loaded into their memory cells. The memory cells are so constructed that each read operation of the cells replaces any charge lost through leakage. hence, a read operation "refreshes" the memory cells. However, such refreshing must occur within a certain period of time, called the refresh period, or the information stored in the memory cells will be lost. The internal construction of a dynamic memory is usually a rectangular matrix even if the external organization is linear. For example, a typical 4KX1 bit dynamic memory is actually constructed as a 64X64 bit matrix array of memory cells. That is, the memory has 64 column sets and 64 row sets. Aside from an improved geometric form factor, cell selection for reading requires the coincidences of accessing both the row set containing the desired cell as well as the column set containing such cell. In accessing a row set, in effect, each memory is read. In accessing a column set the cells of the column are gated open to pass read data. Thus, it is seen the mere accessing of a single memory cell causes the refreshing not only of that memory cell but all other memory cells in its row set. Hence, if each row set is accessed within the required time, all memory cells will be refreshed. Except in an unbranching continuous program there is never a guarantee that all rows will be accessed in any given period of time. Therefore, a separate mechanism must be provided to perform accesses to all rows within the refresh period.

Typically, during systems operation the memory is periodically withheld from operational access of the central processing unit for the time required to refresh all the memory cells. This is accomplished in a single compact burst wherein the rows are sequentially read. Such a burst lasts only for a small portion of the refresh period, generally in the order of a few percent. However, this few percent not only cuts into the available useful operating time of the system, but more importantly has serious effects during the real time processing which requires access to the memory. For example, certain peripherals of the system require memory via Direct Memory Access at a fixed rate and, therefore, cannot wait for the end of the refresh burst.

SUMMARY OF THE INVENTION

It is a general object of the invention to provide an improved method of refreshing the memory cells of a dynamic memory operating with a central processing unit.

It is another operation of the invention to provide a method of blind refreshing such a dynamic memory so that the memory is always available for access during normal processing by the central processing unit.

Briefly, the invention contemplates a data processing system having a dynamic memory and central processing unit. The dynamic memory includes a plurality of memory cells arrayed in a matrix of row sets and column sets wherein each memory cell includes a charge storing element and solid state switches for controlling access to the charge storing element. The central processing unit periodically, either at regular or intermittent times, during major system cycles, accesses the memory for a span of time less than the duration of any major systems cycle to obtain information stored in particular memory cells. The invention takes advantage of the fact that this particular access time is considerably less than the associated major system cycle for the read access (or fetch) operation, and during a portion of such major system cycle when fetching of the desired group of memory cells is not occuring refreshes a group of memory cells by reading such group of cells while at the same time preventing their transfer to the central processing unit. Thus, in effect, during a major system cycle during which a conventional memory read operation is being performed, there can be performed the refreshing of another group of memory cells not necessarily associated with the group of memory cells selected for the read operation.

DESCRIPTION OF THE PREFERRED EMBODIMENT

Figure 1:
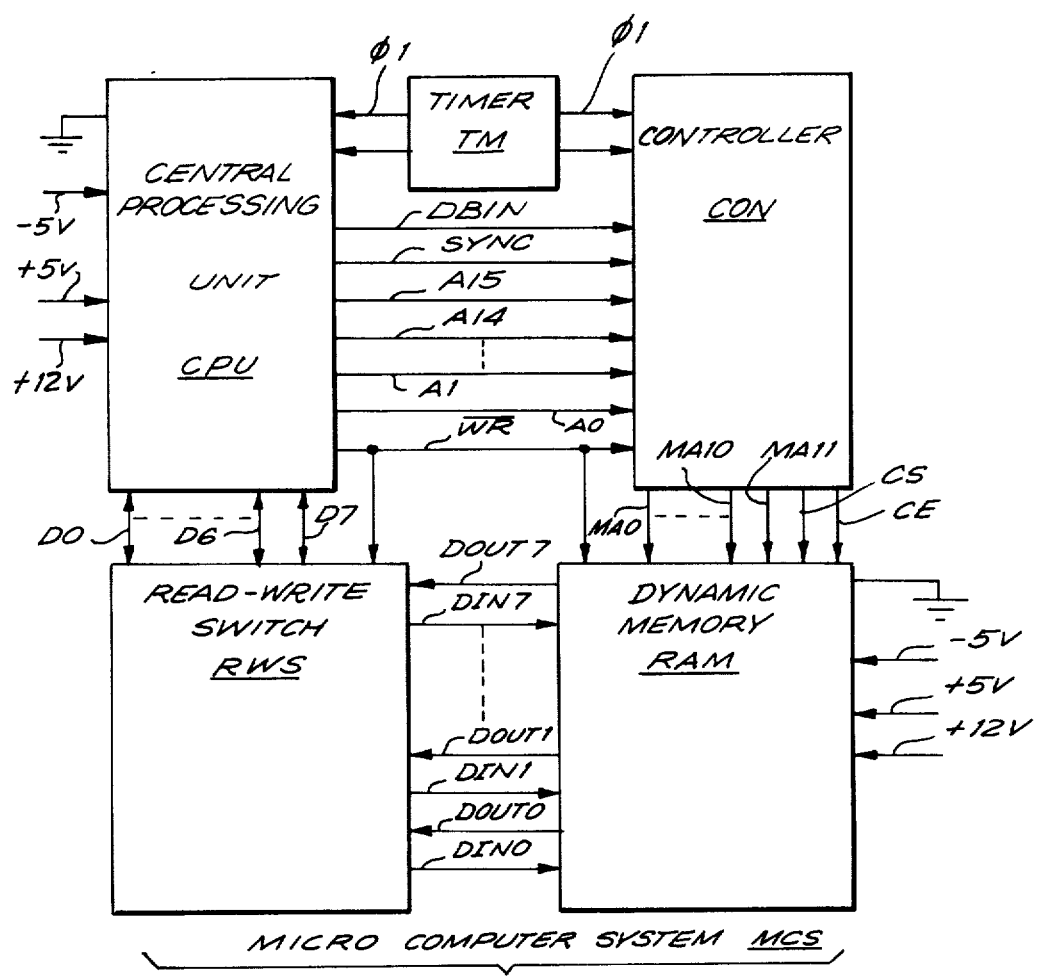
FIG. 1 shows by way of example and not limitation the block diagram of a microcomputer system MCS which practices the invention.

In FIG. 1 there is shown a microcomputer system MCS comprising: a central processing unit CPU having control and arithmetic and logic units for performing processing, and for generating addresses of memory cells, as well as means for accepting and transmitting bytes; a dynamic memory RAM having memory cells arrays in row and column sets wherein the memory cells require periodic refreshing; a read-write switch RWS for controlling the direction of byte flow between the central processing unit CPU and the dynamic memory RAM; a controller CON for selecting memory cells and refreshing memory cells; and a timer TM acting as an overall clock for the system.

Figure 2:
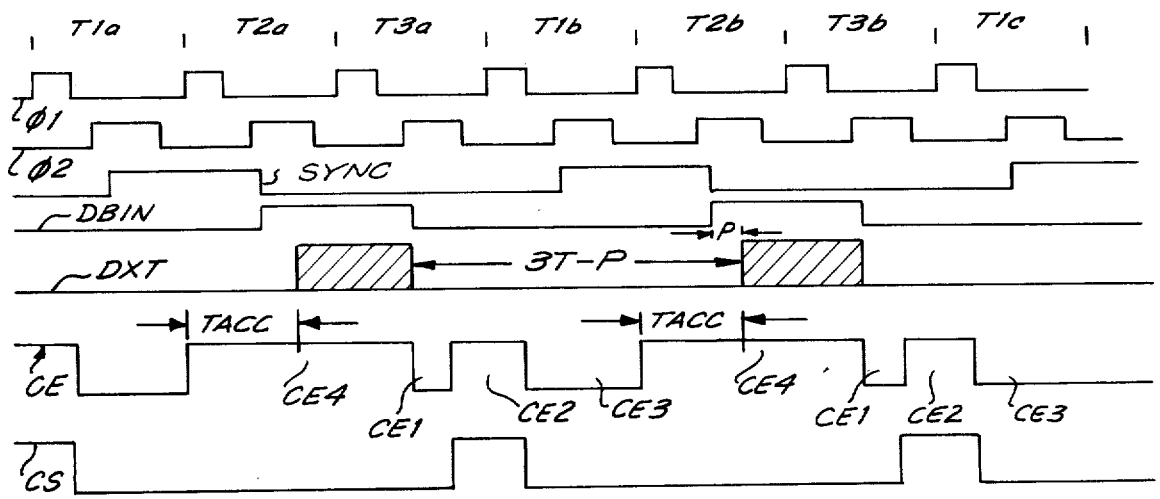
FIG. 2 is a set of waveforms on lines of the system for explaining the operation of the system of FIG. 1.

Before describing the operation of the system, it is best to study the waveforms of FIG. 2 which show two and one-third major system cycles and in particular the major system cycles for two fetch operations. In the system there are never less than three T cycles, T1, T2 and T3 for any central processing unit CPU program step. The T cycles are established by the leading edges of the clock signals $\phi$ from timer TM; also during every T cycle there is another clock signal $\phi 2$, phase displaced with respect to clock signal $\phi 1$. Whenever the central processing unit CPU wishes to fetch a byte from dynamic memory RAM it generates an address on lines A0 to A15, a pulse on line SYNC, and a pulse on line DBIN. The pulse on line SYNC occurs from approximately the midpoint of a T1 cycle to the midpoint of a T2 cycle, while the pulse on line DBIN indicating that the central processing unit CPU will accept data occurs from approximately the midpoint of a T2 cycle to the midpoint of a T3 cycle. The actual time required for the central processing unit to accept data is slightly less than the elapsed time of the DBIN pulse measured from the trailing edge of such pulse. The waveform DXT indicates with the cross-hatched blocks the time when the data from the memory must be available during each fetch operation. A study of the timing reveals that for two sequential fetch operations which is the worst case for spacing between accesses to the memory, there is 3T-P units of time separation. If now a refresh or read operation takes less than this time, then one can safely insert a refresh operation after a fetch operation. To perform a read operation requires a read cycle time TR which must be preceded by a time CE1 called TCE-off to insure that the memory has settled down from a previous access. Time TR comprises times CE2 and CE3. During time CE2 signal CS is low and any output from the memory is blocked. Thus there is a read operation during which a column of the memory is refreshed as usual, however without any output of data. The time CE3 is a settling time similar to time CE1. Time CE4 is the TCE time which causes data to be transmitted to the central processing unit. This time must be greater or equal to time TACC which is the time required for data to become present at the output of the memory. It should be noted that the time between the end of one DXT signal and the start of the next DXT signal comprises the sum times CE1, CE2, CE3 and TACC plus any time in time CE4 up to the next DXT signal. For a typical central processing unit-dynamic memory combination the following times exist. Each T cycle of the central processing unit is 480 nsec, while P is 290 nsec. Therefore, the available time is $3 \times 480 - 290 = 1150$ nsec. Each cycle TR of the memory is 400 nsec, TCE off is 130 nsec and TCE on is 230 nsec. Therefore, the required time is 760 nsec. It is thus seen that there is 390 nsec to spare.

With this in mind, the operation of the system will now be described. During the cycle T1a the central processing unit CPU emits the desired address for fetching on lines A1 to A15 along with a signal on line $\overline{WR}$, indicating this is a fetch and not a write operation, and a signal on line SYNC. The coincidence at the start of cycle T2a of the signals on line SYNC and on line $\phi$ causes the signal on line CE to go high indicating a reading operation in memory RAM. The signal on line CE can be considered as a read signal. The byte that is read is determined by the signals on lines MA0 to MA11 received from controller CON in response to the signals received from lines A0 to A11. The byte is fed via lines DOUT0 to DOUT7, read-write switch WRS and lines D0 to D7 to central processing unit CPU. During cycle T2a the signal on line DBIN goes high indicating the processing unit CPU will accept a byte. At the end of the signal on line DBIN the signal on line CE goes low ending the fetch routine but initiating a refresh operating for the major machine cycle associated with the just completed fetch operation. The dropping of the signal on line DBIN generates a time out period CE1 equivalent to TCE off discussed above. At the end of this period of time, say 130 nsec, the signal on line CE again goes high for a period of time CE2 sufficient to cause a read operation of a row set of memory RAM, say 270 nsec. (Note this time must be such that at the end of this time, there is enough time for the memory to settle down and be prepared for reading if another fetch operation follows.) During time CE2 a row indicated by signals on lines MA0 to MA11 (more particularly lines MA0 to MA5) is read. However, the data is not transmitted from the memory RAM because the signal on line CS from controller CON is high preventing such transfer. The signal on line CS can be considered as a transfer-allow signal. At the end of time CE2 the signal on line CE again goes low and stays low until the coincidence of the next signal on line SYNC and the signal on line $\phi 1$ at the start of the cycle T2b. In this way whenever there is a fetch operation it can be immediately followed by a refresh operation. Within controller CON as will hereinafter become apparent, there is an address generator which sequentially generates addresses associated with the row sets. Thus, the memory cells of the row sets are sequentially refreshed. During memory write operations, which form no part of the invention, the signal on line WR causes read-write switch RWS to connect central processing unit CPU via lines D0 to D7 to dynamic memory RAM. In addition, it modifies the waveform of the signal on line CE so that there is no refresh time CE2.

DESCRIPTION OF SYSTEM COMPONENTS

Although the central processing unit can take several forms a preferred unit is the Intel 8080 Microprocessor, manufactured by Intel Corporation, 3065 Bower Avenue, Santa Clara, Calif. 95051. In such case the pins of such microprocessor chip are connected to the disclosed system according to the following table:

TABLE I

| Pin No. | Signal Line | Pin No. | Signal Line |
|---|---|---|---|
| 1 | A10 | 22 | $\phi 1$ |
| 2 | ground | 25 | A0 |
| 3 | D4 | 26 | A1 |
| 4 | D5 | 27 | A2 |
| 5 | D6 | 28 | +12V |
| 6 | D7 | 29 | A3 |
| 7 | D3 | 30 | A4 |
| 8 | D2 | 31 | A5 |

| Pin No. | Signal Line | Pin No. | Signal Line |
|---|---|---|---|
| 9 | D1 | 32 | A6 |
| 10 | D0 | 33 | A7 |
| 11 | −5V | 34 | A8 |
| 15 | $\phi 2$ | 35 | A9 |
| 17 | DBIN | 36 | A15 |
| 18 | WR | 37 | A12 |
| 19 | SYNC | 38 | A13 |
| 20 | +5V | 39 | A14 |
|  |  | 40 | A11 |

The remaining pins are connected to signal leads which go to peripherals and the lines which form no part of the invention.

With the 8080 microprocessor the T cycle times are a minimum of 480 nsec.

The dynamic memory RAM can be eight Intel Silicon Gate MOS 2107B-Fully Decoded Random Access 4096 Bit Dynamic Memories with a Read Write Cycle time of 400 nsec, and a refresh period of 2 millisec. The memories are connected in parallel lines with each being assigned to one of the eight bits of a byte. The pins of a typical memory plane are connected to the signal lines according to the following table:

TABLE 2

| Pin No. | Signal Line | Pin No. | Signal Line |
|---|---|---|---|
| 1 | −5V | 12 | WR |
| 2 | MA9 | 13 | MA3 |
| 3 | MA10 | 14 | MA4 |
| 4 | MA11 | 15 | MA5 |
| 5 | CS | 16 | not used |
| 6 | DINN | 17 | CE |

TABLE 2-continued

| Pin No. | Signal Line | Pin No. | Signal Line |
|---|---|---|---|
| 7 | DOUTN | 18 | +12V |
| 8 | MA0 | 19 | MA6 |
| 9 | MA1 | 20 | MA7 |
| 10 | MA2 | 21 | MA8 |
| 11 | +5V | 22 | ground |

Note each memory plane is a 64×64 matrix of memory cells wherein the signals on pins 8, 9, 10, 13, 14 and 15 connected to lines MA0 to MA5 select the row set and the signals on pins 19, 20, 21, 2, 3 and 4 connected to lines MA6 to MA11 select the column set.

The time TM can be an Intel Bipolar 8224 Clock Generator and Driver for the 8080 CPU wherein a 9/T cycle (or 18.75MHZ) crystal is connected across pins 14 and 15 and lines $\phi 1$ and $\phi 2$ are connected to pins 10 and 11 respectively.

Figures 3, 4, 5:
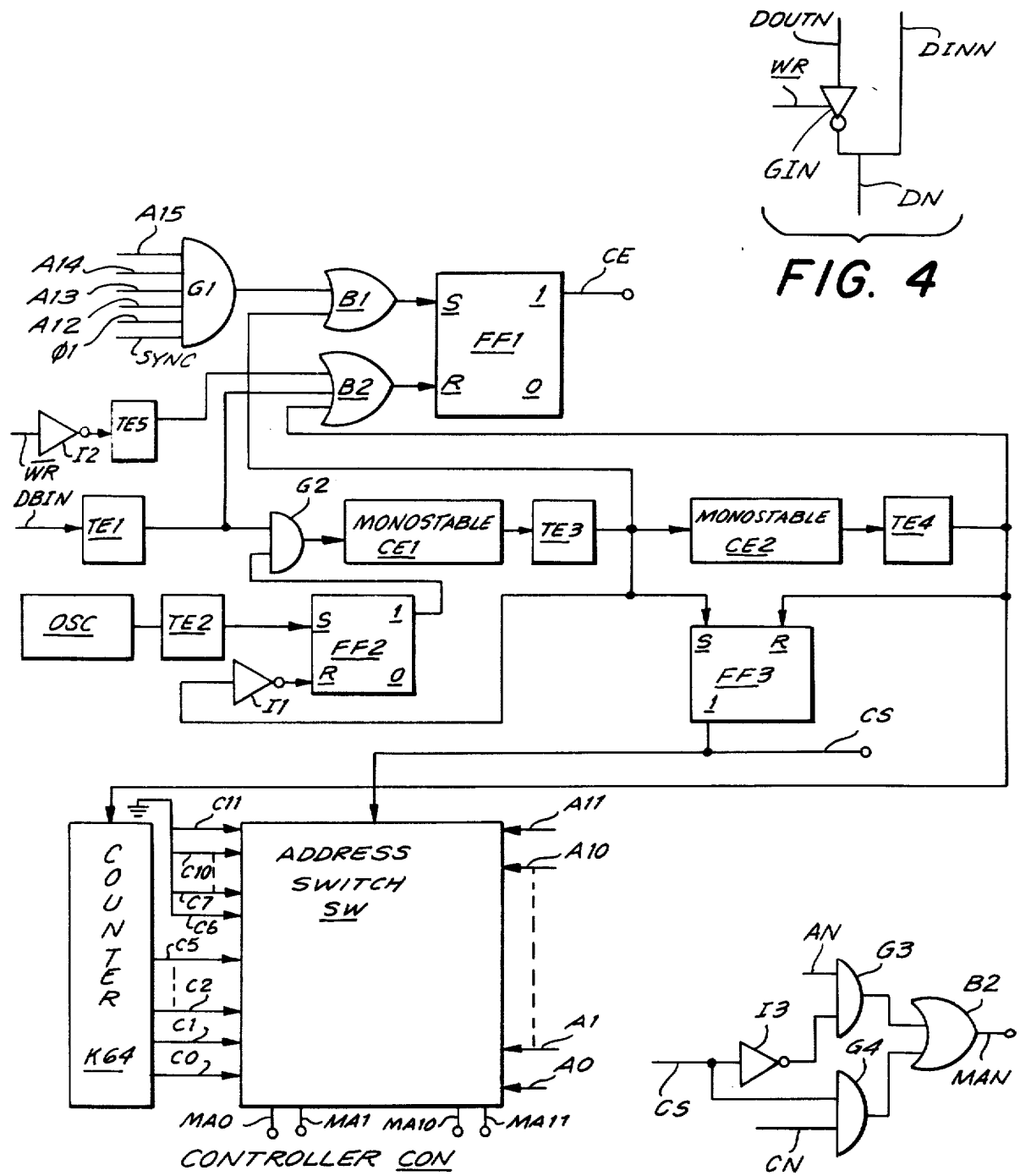
FIG. 3 is a logic and block diagram of the controller used in the system of FIG. 1.
FIG. 4 is a logic diagram of one of the switches used in the read-write switch of FIG. 1.
FIG. 5 is a logic diagram of one of the switches used in the address switch of FIG. 3.

The contoller CON as shown in FIG. 3 centers around flip-flop FF1 which generates the signal on line CE, and address switch SW which selects the row and column sets.

The flip-flop FF1 whose 1-output is connected to line CE has its S-input connected to the output of OR-circuit B1 and its R-input connected to the output of OR-circuit B2. The OR-circuit B1 has a first input connected to the output of AND-circuit G1 whose inputs are connected to lines A12 to A15 and lines $\phi 1$ and SYNC. The OR-circuit B2 has an input connected to the output of trailing edge detector TE1 whose input is connected to line DBIN (Trailing edge detector TE1 and all other such detectors are basically one-shot multivibrators which emit, assuming positive logic, a narrow positive going pulse whenever their input drops from a high to a low). Thus, when memory RAM is selected by unit CPU for a fetch, the lines A12 to A15 will be high so that when there is a coincidence of the timing signal on line $\phi 1$ and the signal on line SYNC, flip-flop FF1 is set and at the end of the signal on line DBIN, flip-flop FF1 is cleared. During that interval indicated by CE4 in FIG. 2 the data byte selected by the signals on lines A0 to A11 is transferred from memory RAM to central processing unit CPU.

The second input of OR-circuit B1 is connected to the output of trailing edge detector TE3 whose input is connected to the output of monostable CE1 having an input connected to the output of AND-circuit G2. (Monostable CE1 for the present example emits a pulse having a 130 nsec duration whenever it is triggered). One input of AND-circuit G2 is connected to the output of detector TE1 and the other input is connected to the 1-output of flip-flop FF2. The R-input of flip-flop FF2 is connected via inverting amplifier I1 to the output of detector TE3. This S-input is connected via trailing edge detector TE2 to the output of oscillator OSC. Oscillator OSC can be a free-running symmettrical multivibrator having a period which is less than one-sixty fourth of the refresh period (by 3 major CPU cycles). Thus, for the present example, since the refresh period is 2 millisec, the multivibrator period can safely be 28 microseconds.

Because of the differences flip-flop FF2 is set by the trailing edge of a pulse from oscillator OSC and awaits the trailing edge of the signal on line DBIN. When this occurs, monostable CE1 is triggered and 130 nsec thereafter flip-flop FF1 is again set. During this 130 nsec from the end of the fetch time CE4 (See FIG. 2) a time interval CE1 is generated to allow the memory to settle. At the end of interval CE1 trailing edge detector TE3 emits a pulse which restores flip-flop FF2 and sets flip-flop FF1 to start the refresh operation. In addition, monostable CE2 is triggered by detector TE3 to emit a 270 nsec pulse. At the end of this pulse trailing edge detector TE4 is triggered and transmits a pulse to a second input of OR-circuit B2 to restore flip-flop FF1, ending the refresh cycle. See waveform CE2 of FIG. 2. During this refresh cycle it is necessary to prevent the transfer of data from the memory. This is accomplished by flip-flop FF3 which is set by the pulse from detector TE3 and cleared by the pulse from detector TE4. The 1-output of the flip-flop is connected to line CS which controls outputting of the memory RAM.

The address switch SW during a fetch operation connects lines A0 to A11 from the central processing unit to lines MA0 to MA11, respectively. However, during a refresh cycle, as indicated by the presence of a signal on line CS, the address switch connects lines C0 to C11 to lines MA0 to MA11 respectively. Since lines C6 to C11 are grounded, the combination of signals on lines C0 to C5 selected a row set for refreshing (the address switch SW comprises eleven identical switch elements, a typical one being shown in FIG. 5 where N can have any value from 0 to 11). In order to insure that the row sets are periodically refreshed, a six-stage modulo-64 counter K64 has its stage outputs connected to lines C0 to C5 respectively. The counter is stepped by pulses from the output of detector TE4. Thus, at the end of every refresh cycle counter K64 is stepped one state making the next row-set available for refresh.

Note the line $\overline{WR}$ is connected via an inverter I2 and a trailing edge detector TE5 to the third input of OR-circuit B2 for use during a write operation which doesn't concern the present invention.

The read-write switch RWS is eight identical switch elements with a typical one being shown in FIG. 4 wherein the input of a gated inverting amplifier GIN is connected to a line DOUTN while the output is connected to line DN which also is connected to line DINN. During a fetch operation the signal on line WR is absent and line DOUTN is connected to line DN, and the output of the memory RAM is connected to the I/0 bus of the central processing unit. During a write operation gated amplifier GIN is blocked and data from the I/0 bus is fed to the input, via a line DINN, of the memory RAM. Although only one embodiment of the invention has been shown and described in detail, there will now be obvious to those skilled in the art many modifications and variations satisfying many or all of the objects without departing from the spirit of the invention as defined by the appended claims.

For example, although the system has been described as refreshing another column for every fetch operation, it is desirable and contemplated for the sake of energy conservation to minimize the refresh operation. This can be accomplished by including in controller CON a circuit which determines the need for refreshing by dividing the maximum refresh period (typically 2 nsec) by the number of columns (64) and taking into account the possibility of major cycles being write operations (not qualified for refresh) and initiate such refresh cycles (every 28 usec).

For example, all times specified herein are exemplary and not limiting . Other times could be used subject to the constraints discussed above.

What is claimed is:

1. In a data processing system comprising a dynamic memory unit connected to a central processing unit, the central processing unit periodically, during major system cycles, emitting a group of memory address signals and a fetch signal for requesting the contents of a memory cell of the dynamic memory unit, and the dynamic memory unit comprising a plurality of memory cells arrayed in a matrix of row sets and column sets wherein each memory cell must be periodically refreshed and wherein a set of memory cells is refreshed when a read signal and the group of memory address signals of at least one of the memory cells of the set are coincidentally received by the dynamic memory unit and the dynamic memory unit emits the contents of a memory cell for transmission to the central processing unit only when a read signal, a transfer-allow signal, and the group of memory address signals of the memory cell are coincidentally received by the dynamic memory unit, the improvement comprising: converting means connected to the central processing unit for converting the fetch signal to a first read signal and to a transfer-allow signal; means for transmitting both the read and transfer-allow signals and the group of memory address signals received with the fetch signal to the dynamic memory unit whereby the contents of the memory cell designated by said group of memory address signals are emitted by the dynamic memory unit for transfer to the central processing unit; memory address signals generating means for sequentially generating groups of memory address signals; supplemental read signal generating means for generating a given period of time after the conversion of the fetch signal to said first read signal but before the end of the major systems cycle during which the fetch signal was generated, a second read signal, and means for transmitting said second read signal and a group of memory address signals generated by said memory address signals generating means but no transfer-allow signal to the dynamic memory unit whereby the set of memory cells containing the memory cell designated by the group of memory address signals generated by said memory address signals generating means is refreshed but the contents of none of the memory cells of said group are emitted by the dynamic memory unit.

2. The data processing system of claim 1 wherein said memory address signals generating means generates a different supplemental set of memory address signals for each of said supplemental read signals.

3. The data processing system of claim 2 wherein the supplemental sets of memory address signals are generated in a sequential and cyclical order.

4. The date processing apparatus of claim 1 wherein said memory address signals generating means comprises a single counter means for generating all supplemental sets of memory address signals for accessing every memory cell of the dynamic memory unit.

5. In a data processing system comprising a central processing unit which periodically, during major system cycles, emits a memory address and a fetch signal for fetching information from a dynamic memory unit, and a dynamic memory unit comprising a plurality of memory cells arrayed in a matrix of row sets and column sets wherein each cell must be periodically refreshed and wherein a set of memory cells is refreshed when a read signal and the memory address of at least one of the memory cells of the set are received by the dynamic memory unit and the dynamic memory unit controllably emits the contents of the memory cell having the memory address received with a read signal, the method of refreshing a set of memory cells of the dynamic memory unit comprising, in a major system cycle in which the central processing unit accesses the dynamic memory unit for fetching information from a memory cell by emitting the memory address of the memory cell and a fetch signal, the steps of converting the fetch signal to a read signal and to a transfer-allow signal whereby the contents of the memory cell selected by the memory address and the fetch signal from the central processing unit are transferred to the central processing unit, and after such transfer but during the same major system cycle generating another memory address of at least one memory cell of a set of memory cells and another read signal but no transfer-allow signal so that the set of memory cells associated with the memory cell having said other memory address is refreshed, but the contents of no memory cell of said set is then transferred from the dynamic memory unit because of the absence of the transfer-allow signal.

6. In a data processing system comprising a dynamic memory unit connected to a central processing unit, said central processing unit operating in major system cycles and emitting a set of memory address signals and a fetch signal whenever it requires the contents of at least one memory cell of the dynamic memory unit during a major system cycle, said dynamic memory unit including a plurality of memory cells requiring periodic refreshing, said refreshing being accomplished by the receipt of only a set of memory address signals and a read signal, and said dynamic memory unit emitting for transfer to the central processing unit the contents of at least one memory cell indicated by the set of memory address signals received in conjunction with a read signal and a transfer-allow signal, the improvement comprising: converting means for converting at least a portion of the set of address signals or the fetch signal to a transfer-allow signal and to a first read signal occurring during the same major system cycle as the fetch signal, generating means, responsive to said converting means, for generating a supplemental read signal a given period of time after the generation of the first read signal but during the same major system cycle as the fetch signal; memory address signal generating means for generating supplemental sets of memory address signals; means for transmitting the transfer-allow signal, the read signal and the memory address signals associated with the fetch signal to the dynamic memory unit during the major system cycle when the fetch signal was generated by the central processing unit whereby the contents of at least one memory cell is emitted by the dynamic memory unit and a group of memory cells associated with said memory address signals is refreshed and, said given period of time thereafter, only transmitting said supplemental read signal as a read signal and one of the supplemental sets of memory address signals to the dynamic memory unit whereby the group of memory cells associated with said one supplemental set of memory address signals is also refreshed.

* * * * *